United States Patent [19]

Krogh

[11] Patent Number: 4,949,670

[45] Date of Patent: Aug. 21, 1990

[54] METHOD AND APPARATUS FOR LOW PRESSURE PLASMA

[75] Inventor: Ole Krogh, San Francisco, Calif.

[73] Assignee: Tegal Corporation, Petaluma, Calif.

[21] Appl. No.: 267,193

[22] Filed: Nov. 4, 1988

[51] Int. Cl.$^5$ .............................................. C23C 16/50
[52] U.S. Cl. .................................. 118/723; 118/692; 156/627; 156/345
[58] Field of Search ................ 118/723, 692; 156/627, 156/345

[56] References Cited

U.S. PATENT DOCUMENTS 4,609,426  9/1986  Ogawa ........................... 156/627

FOREIGN PATENT DOCUMENTS 56-7432    1/1981  Japan ........................... 156/627
59-194424 11/1984  Japan ........................... 118/692

Primary Examiner—Richard Bueker
Attorney, Agent, or Firm—Paul F. Wille

[57] ABSTRACT

In a magnetically confined plasma, optimal pressure is found by measuring the peak to peak voltage of the plasma and looking for a distinct minimum in the peak to peak voltage. The pressure at which the minimum occurs can be used to calibrate a manometer used in the system.

3 Claims, 1 Drawing Sheet

METHOD AND APPARATUS FOR LOW PRESSURE PLASMA

BACKGROUND OF THE INVENTION

This invention relates to treating articles in a plasma glow discharge and, in particular, to etching semiconductor wafers in a magnetically confined plasma at low pressure.

In the prior art, a variety of processes have evolved for treating semiconductor wafers. For etch processes, measures of quality have included uniformity and etch rate. In the quest for improving quality, and partially as a result of treating larger wafers than previously treated, progressively more RF power is applied to the plasma. A difficulty arises with increasing the power due to the decrease in the size of the devices being formed on the wafer. The devices are more delicate and some devices cannot withstand the applied power.

One solution to this has been to generate the plasma remotely, e.g. using microwave radiation, and locating the wafer downstream from the generator. This approach is not without its own difficulties.

Another approach has been to magnetically confine the plasma. This has the effect of electrically removing the conductive walls of the chamber from the plasma by reflecting ions or electrons back into the interior of the discharge. The result is a more efficient generation of ions with reduced power.

This solution is incomplete or, more accurately, introduces its own problem. Minimum device damage depends on generating ions having the least energy possible yet still effective in etching. In general, this occurs at relatively low pressures, lower than commonly used previously, e.g. one millitorr. At such pressures, commercially available manometers, even high quality ones, become inaccurate. For example, a manometer exposed to atmospheric pressure typically has an offset error of several millitorr. Thus, measuring pressure at one millitorr or below becomes an estimate at best.

In view of the foregoing, it is therefore an object of the present invention to provide improved means for measuring or controlling gas pressure in the range of sixty millitorr and below in magnetically confined glow discharges.

In accordance with another aspect of the present invention, it is an object to provide means for optimizing a plasma etch cycle.

SUMMARY OF THE INVENTION

The foregoing object is achieved in the present invention, based upon the discovery that a plot of the peak to peak voltage of the plasma as a function of pressure has a distinct curve which enables one to optimize the operation of the apparatus. Specifically, the curve has a distinct minimum at low pressure indicating the optimum operating point for minimum damage. Thus, monitoring the peak to peak voltage of the plasma for a predetermined time, varying the pressure in the chamber to achieve a minimum peak to peak voltage, and treating a wafer at or near the pressure corresponding to the minimum peak to peak voltage will produce minimum damage to the wafer. This technique is readily incorporated into a closed loop control system wherein the pressure is initially reduced using a manometer to provide the initial pressure measurement, then monitoring the peak to peak voltage while adjusting pressure to achieve its final value for the process. This adjustment is readily accomplished via a gate valve located between the chamber and the vacuum pump in the system.

BRIEF DESCRIPTION OF THE DRAWINGS

A more complete understanding of the present invention can be obtained by considering the following detailed description in conjunction with the accompanying drawings, in which.

DETAILED DESCRIPTION OF THE INVENTION

Figure 1:
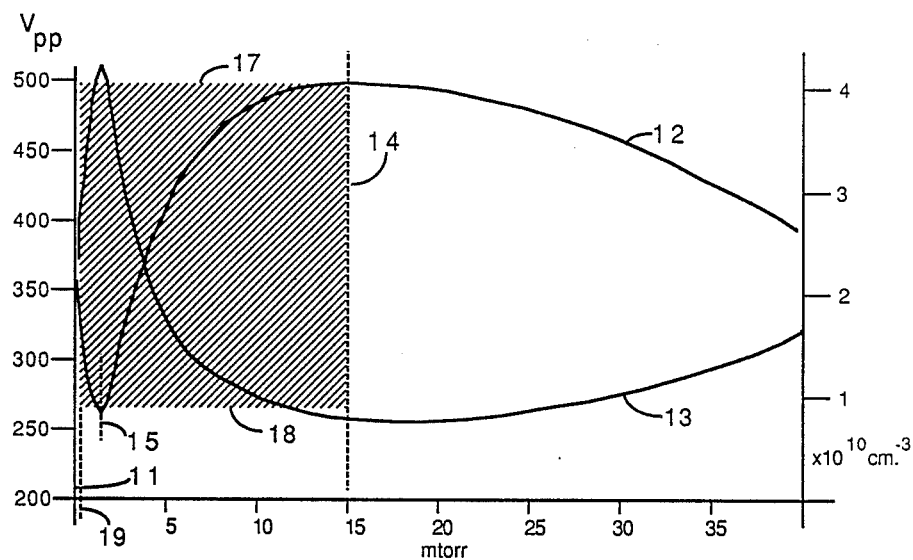
FIG. 1 illustrates a plot of peak to peak voltage as a function of pressure.

In FIG. 1, the abscissa represents increasing pressure as one moves from left to right. The ordinate represents peak to peak voltage. Curve 12 is a plot of peak to peak voltage for a typical etch process. Curve 13 is a plot of ion density for a typical etch process. While not mirror images of each other, because curves 12 and 13 represent actual data taken from different processes, it is apparent that curves 12 and 13 represent related, inverse, parameters.

Each of these curves can be interpreted as representing information other than that actually used for generating it. For example, the peak to peak voltage, i.e. the envelope of the continuous wave, RF power applied to the plasma, is also indicative of the impedance of the reactor in which the glow discharge takes place or, more specifically the impedance of the parallel plates within the chamber between which the glow discharge takes place. Similarly, curve 13 could be interpreted as a plot of the current through the chamber as a function of pressure, i.e. as the ionization increases the current increases and the peak to peak voltage decreases.

Considering the situation in which a chamber is pumped down in pressure while a glow discharge takes place, one obtains a curve similar to the right hand portion of curve 12, as illustrated in FIG. 1. Specifically, as the chamber is pumped down, the reduction in pressure causes a corresponding reduction in the number of available ions, as indicated by curve 13. Since the number of ions is reduced, the impedance and the peak to peak voltage of the chamber increase. In the absence of magnetic confinement this trend continues as the pressure is further reduced.

At some first pressure, indicated by bar 14, and in the presence of magnetic confinement, the plasma is characterized by a broad peak. As the pressure is further reduced, the ionization increases rather than decreases. This is believed due to the effect of the magnetic confinement, which electrically isolates the plasma from the conductive walls of the chamber. Also, at reduced pressure, the mean free path of the ions is increased due to the reduction in molecular collisions. Since the ions are reflected back into the plasma itself, the ionization of the gases increases, thereby reducing the peak to peak voltage of the plasma. The actual value of pressure 14 depends upon the characteristics of the chamber and the gases utilized. For commonly used gases, such as Ar, $Cl_2$, HBr, Xe, it has been found that pressure 14 corresponds to 30-60 millitorr. Only helium has been found to be an exception. For helium, the minimum is at about 20 mTorr and the maximum at about 200mTorr.

As the pressure is further reduced, the ionization of the plasma increases and the peak to peak voltage decreases until a minimum is reached at pressure 15. At this point, in effect, one has obtained maximum efficiency from the reactor in terms of the ionization of the gas within the chamber. Reducing the pressure further only depletes the supply of ions, thereby increasing the peak to peak voltage of the plasma. At some pressure, one reaches a point at which the production of ions ceases to be sufficient to provide a useful etch rate.

In accordance with the present invention, it has been found that operating a plasma reactor within the area bounded pressures 19 and 14 and peak to peak voltages 17 and 18 provides optimal etching. In particular, etching at pressure 15, corresponding to minimum peak to peak voltage 18, provides minimal damage to the wafers. Minimum pressure 15 is obtained within a very narrow pressure range, e.g. plus or minus 5 millitorr. Thus while the difference between pressures 19 and 14 can correspond to 30-60 millitorr, the particular benefits of the present invention are obtained within a relatively narrow range about the pressure corresponding to minimum peak to peak voltage.

Figure 2:
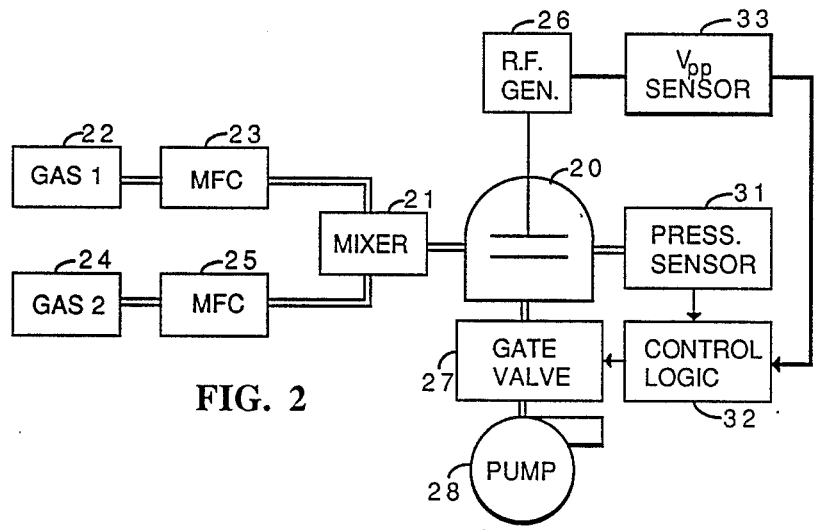
FIG. 2 illustrates a preferred embodiment of the present invention.

FIG. 2 illustrates a preferred embodiment of the present invention wherein chamber 20 contains the glow discharge and is supplied with one or more gases from mixing chamber 21. Mixing chamber 21, in turn, is provided with gases from supply 22 by way of mass flow controller 23 and supply 24 by way of mass flow controller 25. It is understood by those of skill in the art that the number and mixing of the gases is a matter of choice depending upon the particular process being run. Chamber 20 is pumped down by way of gate valve 27 and vacuum pump 28. The glow discharge is provided by RF generator 26 which is connected to at least one pair of electrodes within chamber 20. Pressure within the chamber is monitored by pressure sensor 31 which preferably comprises a capactive manometer. Peak to peak sensor 33 is connected to RF generator 26 and provides an output indicative of the peak to peak voltage to control logic 32.

In accordance with the present invention, one can operate the system illustrated in FIG. 2 manually or in a closed loop control system. If manual operation is desired, one simply monitors the peak to peak voltage to determine the minimum and then maintains the system in that condition while treating wafers in chamber 20.

For automatic operation, one can use control logic 32 for operating gate valve 27 to control the pumping of chamber 20. As known to those of skill in the art, one technique for controlling the pressure within chamber 20 is to supply gases at a rate less than the capacity of the vacuum pump and regulating the pumping of the chamber to control pressure within the chamber.

As previously indicated, the minimum peak to peak voltage occurs at a relatively narrow pressure range. It is therefore desirable in a closed loop control system to use prior art pressure measurement techniques to provide a coarse pressure measurement while the chamber is pumped down to the operating area indicated in FIG. 1. Within that area the information from peak to peak sensor 33 is utilized to provide a fine adjustment to the pressure within the chamber by controlling gate valve 27. This, for example, helps the control logic avoid misinterpreting the negative slope at higher pressure of curve 12 with the negative slope at lower pressure of curve 12, since sensor 33 is not actually measuring pressure at all but peak to peak voltage.

The actual implementation of sensor 33 and control logic 32 is straightforward and readily within the skill of those familiar with such circuits. For example, control logic 32 can comprise either analog or digital electronics for slope detection and measurement of peak to peak voltage.

The apparatus illustrated in FIG. 2 can be operated so as to optimize etch results, e.g. selectivity, as seen in scanning electron micrographs. In this case, for reasons which are not entirely clear, optimum operation appears to be in the vicinity of pressure 14. In short, one may be compromising device damage to improve other parameters. Operating the reactor at the optimum pressure, away from the minimum peak to peak voltage can be difficult to do in a controlled manner due to the none linear nature of curve 12 as well as the breadth of the peak at pressure 14.

In accordance with another aspect of the present invention, the pressure sensor is calibrated for a given process by monitoring the peak to peak voltage while pressure is reduced. When the minimum peak to peak voltage is found, control logic 32 thereafter interprets pressure 15 a reference pressure. Since the pressure varies linearly, one simply monitors pressure with sensor 31 to select a pressure between pressure 15 and pressure 14. The calibration is repeated daily, for example, or when process conditions change, e.g. when the gas mixture is changed or when the applied power changes signficiantly. The result is greater wafer to wafer uniformity despite pressure sensor 31 working at or beyond the limit of its range.

There is thus provided by the present invention a method and apparatus for operating a magnetic confined glow discharge in such as to provide minimum damage or optimal etch at low pressures.

Having thus described the invention it will be apparent to those of skill in the art that various modifications can be made within the spirit and scope of the present invention. For example, while illustrated in conjunction with a diode reactor, it is understood that the present invention applies to triode reactors as well. Similarly the present invention is useful for any magnetically confined plasma, including those utilizing microwave induced discharges, such as those known as Electron Cyclotron Resonance systems wherein the applied frequency is carefully matched to the magnetic field to produce the resonance. In ECR systems, the pressure is reduced even further and such systems typically run at one-tenth of a millitorr or lower. At such pressures it is even more necessary to determine the proper operating point of the chamber since ordinary manometers are no longer useful.

I claim:

1. In apparatus for treating a semiconductor wafer with a glow discharge in a chamber including means for supplying one or more gases to said chamber, means for exhausting gases from said chamber, means for supplying RF power to said chamber, and means for magnetically confining said glow discharge, the improvement comprising:

means coupled to said means for supplying RF power to said chamber for monitoring the peak to peak voltage within said chamber and producing a control signal in response thereto; and means for maintaining the pressure within said chamber at or near a pressure corresponding to a minimum peak to peak voltage in response to said control signal.

2. The apparatus as set forth in claim 1 wherein said means for maintaining comprises a gate valve interconnecting said means for exhausting gases and said chamber.

3. The apparatus as set forth in claim 1 wherein said means for maintaining comprises logic means coupled to said means for monitoring for detecting minima in said control signal and for providing corresponding pressure adjusting signals to said means for maintaining the pressure.

* * * * *